United States Patent
Yamaguchi et al.

(10) Patent No.: US 9,393,645 B2
(45) Date of Patent: Jul. 19, 2016

(54) JUNCTION MATERIAL, MANUFACTURING METHOD THEREOF, AND MANUFACTURING METHOD OF JUNCTION STRUCTURE

(75) Inventors: Takuto Yamaguchi, Toride (JP);
Masahide Okamoto, Yokohama (JP);
Osamu Ikeda, Yokohama (JP);
Hiromitsu Kuroda, Hitachi (JP);
Kazuma Kuroki, Hitachinaka (JP);
Shohei Hata, Yokohama (JP); Yuichi Oda, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 13/700,294

(22) PCT Filed: Jul. 28, 2011

(86) PCT No.: PCT/JP2011/067335
§ 371 (c)(1),
(2), (4) Date: Feb. 11, 2013

(87) PCT Pub. No.: WO2012/029470
PCT Pub. Date: Mar. 8, 2012

(65) Prior Publication Data
US 2013/0256390 A1    Oct. 3, 2013

(30) Foreign Application Priority Data

Aug. 31, 2010  (JP) ................ 2010-193885
Apr. 25, 2011  (JP) ................ 2011-097178

(51) Int. Cl.
*B21B 3/00*  (2006.01)
*B23K 35/00*  (2006.01)
(Continued)

(52) U.S. Cl.
CPC ............ *B23K 35/0238* (2013.01); *B21B 3/00* (2013.01); *B23K 1/0016* (2013.01);
(Continued)

(58) Field of Classification Search
USPC .......... 228/262.5, 262.51; 428/615, 646, 650, 428/654, 658
See application file for complete search history.

(56) References Cited

U.S. PATENT DOCUMENTS 2,100,255 A * 11/1937 Larson .................... 428/607
2,987,814 A *  6/1961 Singleton, Jr. et al. ...... 228/158
(Continued)

FOREIGN PATENT DOCUMENTS

JP    52-129628    10/1977
JP    62-163335    7/1987
(Continued)

OTHER PUBLICATIONS

PCT International Search Report on application PCT/JP2011/067335, mailed Oct. 25, 2011; 2 pages.

*Primary Examiner* — Devang R Patel
(74) *Attorney, Agent, or Firm* — Foley & Lardner LLP

(57) ABSTRACT

The disclosed junction material, manufacturing method thereof, and manufacturing method of junction structure utilize lead-free materials and ensure a high reliability of the junction between a semiconductor element and a frame or substrate, or, between a metal plate and another metal plate. For junctions between a semiconductor element and a frame or substrate, by using as the JUNCTION MATERIAL a laminate material comprising a Zn-based metallic layer (101), Al-based metallic layers (102a, 102b) on both sides thereof, and X-based metallic layers (103a, 103b) (X=Cu, Au, Ag or Sn) on the outside of both the Al-based metallic layers (102a, 102b), even in an oxygen-rich environment, the superficial X-based metallic layers protect the Zn and Al from oxidation until said junction material melts, preserving the wettability and bondability of said junction material as solder and securing the high reliability of the junction.

17 Claims, 13 Drawing Sheets

(51) Int. Cl.
| | |
|---|---|
| *B23K 35/02* | (2006.01) |
| *B23K 1/00* | (2006.01) |
| *B23K 35/28* | (2006.01) |
| *B23K 35/30* | (2006.01) |
| *B23K 35/38* | (2006.01) |
| *B32B 15/01* | (2006.01) |
| *C22C 5/02* | (2006.01) |
| *C22C 9/00* | (2006.01) |
| *C22F 1/00* | (2006.01) |
| *C22F 1/04* | (2006.01) |
| *C22F 1/08* | (2006.01) |
| *C22F 1/16* | (2006.01) |
| *H01L 21/50* | (2006.01) |
| *H01L 23/06* | (2006.01) |
| *H01L 23/10* | (2006.01) |
| *H01L 23/373* | (2006.01) |
| *H01L 23/495* | (2006.01) |
| *H01L 23/00* | (2006.01) |
| *H01L 23/31* | (2006.01) |

(52) U.S. Cl.
CPC .......... *B23K 35/282* (2013.01); *B23K 35/286* (2013.01); *B23K 35/302* (2013.01); *B23K 35/38* (2013.01); *B23K 35/383* (2013.01); *B32B 15/017* (2013.01); *B32B 15/018* (2013.01); *C22C 5/02* (2013.01); *C22C 9/00* (2013.01); *C22F 1/00* (2013.01); *C22F 1/04* (2013.01); *C22F 1/08* (2013.01); *C22F 1/165* (2013.01); *H01L 21/50* (2013.01); *H01L 23/06* (2013.01); *H01L 23/10* (2013.01); *H01L 23/3735* (2013.01); *H01L 23/49513* (2013.01); *H01L 23/49582* (2013.01); *H01L 24/27* (2013.01); *H01L 24/29* (2013.01); *H01L 24/32* (2013.01); *H01L 24/743* (2013.01); *H01L 24/83* (2013.01); *B23K 2201/40* (2013.01); *H01L 23/3107* (2013.01); *H01L 24/48* (2013.01); *H01L 24/73* (2013.01); *H01L 2224/2784* (2013.01); *H01L 2224/29101* (2013.01); *H01L 2224/32225* (2013.01); *H01L 2224/32245* (2013.01); *H01L 2224/48091* (2013.01); *H01L 2224/48137* (2013.01); *H01L 2224/48227* (2013.01); *H01L 2224/48247* (2013.01); *H01L 2224/48472* (2013.01); *H01L 2224/73265* (2013.01); *H01L 2224/838* (2013.01); *H01L 2224/8382* (2013.01); *H01L 2224/83101* (2013.01); *H01L 2924/00011* (2013.01); *H01L 2924/00014* (2013.01); *H01L 2924/013* (2013.01); *H01L 2924/0103* (2013.01); *H01L 2924/014* (2013.01); *H01L 2924/01004* (2013.01); *H01L 2924/01005* (2013.01); *H01L 2924/0105* (2013.01); *H01L 2924/01006* (2013.01); *H01L 2924/01012* (2013.01); *H01L 2924/01013* (2013.01); *H01L 2924/01019* (2013.01); *H01L 2924/01025* (2013.01); *H01L 2924/01029* (2013.01); *H01L 2924/0132* (2013.01); *H01L 2924/01032* (2013.01); *H01L 2924/01033* (2013.01); *H01L 2924/01046* (2013.01); *H01L 2924/01047* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/01327* (2013.01); *H01L 2924/10329* (2013.01); *H01L 2924/12041* (2013.01); *H01L 2924/12042* (2013.01); *H01L 2924/13055* (2013.01); *H01L 2924/13091* (2013.01); *H01L 2924/15787* (2013.01); *H01L 2924/16152* (2013.01); *H01L 2924/181* (2013.01); *Y10T 428/12708* (2015.01); *Y10T 428/12736* (2015.01); *Y10T 428/12792* (2015.01)

(56) References Cited

U.S. PATENT DOCUMENTS

| | | | | |
|---|---|---|---|---|
| 3,167,405 | A | * | 1/1965 | Muije et al. .................. 428/650 |
| 6,203,928 | B1 | | 3/2001 | Lewin |
| 6,203,929 | B1 | * | 3/2001 | Muller ........................ 428/643 |
| 6,278,184 | B1 | * | 8/2001 | Brofman et al. ............. 257/737 |
| 6,563,225 | B2 | * | 5/2003 | Soga et al. .................. 257/782 |
| 7,451,906 | B2 | * | 11/2008 | Kisielius et al. ............. 228/56.3 |
| 8,283,783 | B2 | * | 10/2012 | Yamada et al. .............. 257/772 |
| 8,348,139 | B2 | * | 1/2013 | Liu et al. ..................... 228/246 |
| 2002/0149114 | A1 | | 10/2002 | Soga et al. |
| 2004/0134966 | A1 | * | 7/2004 | Chang et al. ................ 228/56.3 |
| 2008/0206590 | A1 | * | 8/2008 | Ikeda et al. .................. 428/650 |
| 2008/0230905 | A1 | | 9/2008 | Guth et al. |
| 2010/0193801 | A1 | | 8/2010 | Yamada et al. |
| 2011/0139858 | A1 | * | 6/2011 | Cho et al. .................... 228/176 |
| 2012/0000965 | A1 | | 1/2012 | Ikeda et al. |
| 2012/0098134 | A1 | | 4/2012 | Okamoto et al. |

FOREIGN PATENT DOCUMENTS

| | | | |
|---|---|---|---|
| JP | 02121786 | A * | 5/1990 |
| JP | 2002-307188 | A | 10/2002 |
| JP | 2007-013064 | A | 1/2007 |
| JP | 2008-126272 | A | 6/2008 |
| JP | 2009-125753 | A | 6/2009 |
| JP | 2009-142890 | A | 7/2009 |
| JP | 2009-285732 | A | 12/2009 |
| JP | 2010-73908 | A | 4/2010 |
| JP | 2011-056555 | A | 3/2011 |
| JP | 2011-060926 | A | 3/2011 |
| JP | 2011-218364 | A | 11/2011 |
| JP | 2011-224598 | A | 11/2011 |
| JP | 2012-000629 | A | 1/2012 |
| JP | 2012-074726 | A | 4/2012 |

\* cited by examiner

PROCESS BACK SURFACE IN SIMILAR WAY

FIG. 11

TABLE 1

| No. | TYPE OF X | THICKNESS OF EACH LAYER ($\mu$m) | | | | | TOTAL THICKNESS |
| --- | --- | --- | --- | --- | --- | --- | --- |
| | | X THICKNESS | Al THICKNESS | Zn THICKNESS | Al THICKNESS | X THICKNESS | |
| 1 | Cu | 11 | 7.5 | 90 | 7.5 | 11 | 127 |
| 2 | Cu | 1 | 7.5 | 90 | 7.5 | 1 | 107 |
| 3 | Cu | 0.5 | 7.5 | 90 | 7.5 | 0.5 | 106 |
| 4 | Cu | 0.001 | 7.5 | 90 | 7.5 | 0.001 | 105 |
| 5 | Cu | 1 | 22 | 250 | 22 | 1 | 296 |
| 6 | Cu | 1 | 8 | 45 | 8 | 1 | 63 |
| 7 | Cu | 0.5 | 4.8 | 280 | 4.8 | 0.5 | 290.6 |
| 8 | Cu | 0.5 | 3.8 | 45 | 3.8 | 0.5 | 53.6 |
| 9 | Cu | 1 | 15 | 180 | 15 | 1 | 212 |
| 10 | Cu | 0.5 | 15 | 90 | 15 | 0.5 | 121 |
| 11 | Cu | 1 | 8 | 200 | 8 | 1 | 218 |
| 12 | Cu | 1 | 3 | 90 | 3 | 1 | 98 |
| 13 | Cu | 0.05 | 7 | 70 | 7 | 0.05 | 84.1 |
| 14 | Au | 0.05 | 8 | 90 | 8 | 0.05 | 106.1 |
| 15 | Au | 0.01 | 7 | 90 | 7 | 0.01 | 104.02 |
| 16 | Au | 0.003 | 8 | 100 | 8 | 0.003 | 116.01 |
| 17 | Au | 0.005 | 6 | 80 | 6 | 0.005 | 92.01 |
| 18 | Ag | 0.05 | 8 | 90 | 8 | 0.05 | 106.1 |
| 19 | Ag | 0.01 | 7 | 90 | 7 | 0.01 | 104.02 |
| 20 | Ag | 0.1 | 8 | 100 | 8 | 0.1 | 116.2 |
| 21 | Ag | 0.05 | 6 | 80 | 6 | 0.05 | 92.1 |
| 22 | Sn | 5 | 10 | 90 | 10 | 5 | 120 |
| 23 | Sn | 6.5 | 8 | 50 | 8 | 6.5 | 79 |
| 24 | Sn | 10 | 10 | 80 | 10 | 10 | 120 |

FIG. 12

TABLE 2

| | | CONNECTING MATERIAL | WETTABILITY | | CONNECTIVITY | | | | OVERALL EVALUATION |
|---|---|---|---|---|---|---|---|---|---|
| | No. | COMPOSITION/ STRUCTURE | RESIDUAL X | WETTING | $N_2$ +10ppm$O_2$ | $N_2$ +100ppm$O_2$ | $N_2$+4%$H_2$ +10ppm$O_2$ | $N_2$+4%$H_2$ +100ppm$O_2$ | |
| EXAMPLE | 1 | Cu/Al/Zn/Al/Cu | ○ | ○ | ○ | ○ | ○ | ○ | ○ |
| | 2 | Cu/Al/Zn/Al/Cu | ○ | ○ | ○ | ○ | ○ | ○ | ○ |
| | 3 | Cu/Al/Zn/Al/Cu | ○ | ○ | ○ | ○ | ○ | ○ | ○ |
| | 4 | Cu/Al/Zn/Al/Cu | ○ | ○ | ○ | ○ | ○ | ○ | ○ |
| | 5 | Cu/Al/Zn/Al/Cu | ○ | ○ | ○ | ○ | ○ | ○ | ○ |
| | 6 | Cu/Al/Zn/Al/Cu | ○ | ○ | ○ | ○ | ○ | ○ | ○ |
| | 7 | Cu/Al/Zn/Al/Cu | ○ | ○ | ○ | ○ | ○ | ○ | ○ |
| | 8 | Cu/Al/Zn/Al/Cu | ○ | ○ | ○ | ○ | ○ | ○ | ○ |
| | 9 | Cu/Al/Zn/Al/Cu | ○ | ○ | ○ | ○ | ○ | ○ | ○ |
| | 10 | Cu/Al/Zn/Al/Cu | ○ | ○ | ○ | ○ | ○ | ○ | ○ |
| | 11 | Cu/Al/Zn/Al/Cu | ○ | ○ | ○ | ○ | ○ | ○ | ○ |
| | 12 | Cu/Al/Zn/Al/Cu | ○ | ○ | ○ | ○ | ○ | ○ | ○ |
| | 13 | Cu/Al/Zn/Al/Cu | ○ | ○ | ○ | ○ | ○ | ○ | ○ |
| | 14 | Au/Al/Zn/Al/Au | ○ | ○ | ○ | ○ | ○ | ○ | ○ |
| | 15 | Au/Al/Zn/Al/Au | ○ | ○ | ○ | ○ | ○ | ○ | ○ |
| | 16 | Au/Al/Zn/Al/Au | ○ | ○ | ○ | ○ | ○ | ○ | ○ |
| | 17 | Au/Al/Zn/Al/Au | ○ | ○ | ○ | ○ | ○ | ○ | ○ |
| | 18 | Ag/Al/Zn/Al/Ag | ○ | ○ | ○ | ○ | ○ | ○ | ○ |
| | 19 | Ag/Al/Zn/Al/Ag | ○ | ○ | ○ | ○ | ○ | ○ | ○ |
| | 20 | Ag/Al/Zn/Al/Ag | ○ | ○ | ○ | ○ | ○ | ○ | ○ |
| | 21 | Ag/Al/Zn/Al/Ag | ○ | ○ | ○ | ○ | ○ | ○ | ○ |
| | 22 | Sn/Al/Zn/Al/Sn | ○ | ○ | ○ | ○ | ○ | ○ | ○ |
| | 23 | Sn/Al/Zn/Al/Sn | ○ | ○ | ○ | ○ | ○ | ○ | ○ |
| | 24 | Sn/Al/Zn/Al/Sn | ○ | ○ | ○ | ○ | ○ | ○ | ○ |
| COMPARATIVE EXAMPLE | 1 | Zn/Al/Zn | − | ○ | ○ | × | × | × | × |
| | 2 | Cu/Zn-Al/Cu | × | ○ | ○ | × | ○ | × | × |

FIG. 13

TABLE 3

| No. | TYPE OF X | THICKNESS OF EACH LAYER($\mu$m) | | | TOTAL THICKNESS |
|---|---|---|---|---|---|
| | | Zn THICKNESS | Al THICKNESS | X THICKNESS | |
| 25 | Cu | 90 | 15 | 22 | 127 |
| 26 | Cu | 90 | 15 | 2 | 107 |
| 27 | Cu | 90 | 15 | 1 | 106 |
| 28 | Cu | 90 | 15 | 0.002 | 105.002 |
| 29 | Cu | 250 | 44 | 2 | 296 |
| 30 | Cu | 45 | 16 | 2 | 63 |
| 31 | Cu | 280 | 9.6 | 1 | 290.6 |
| 32 | Cu | 45 | 7.6 | 1 | 53.6 |
| 33 | Cu | 180 | 30 | 2 | 212 |
| 34 | Cu | 90 | 30 | 1 | 121 |
| 35 | Cu | 200 | 16 | 2 | 218 |
| 36 | Cu | 90 | 6 | 2 | 98 |
| 37 | Cu | 70 | 14 | 0.1 | 84.1 |
| 38 | Au | 90 | 16 | 0.1 | 106.1 |
| 39 | Au | 90 | 14 | 0.02 | 104.02 |
| 40 | Au | 100 | 16 | 0.006 | 116.006 |
| 41 | Au | 80 | 12 | 0.01 | 92.01 |
| 42 | Ag | 90 | 16 | 0.1 | 106.1 |
| 43 | Ag | 90 | 14 | 0.02 | 104.02 |
| 44 | Ag | 100 | 16 | 0.2 | 116.2 |
| 45 | Ag | 80 | 12 | 0.1 | 92.1 |
| 46 | Sn | 90 | 20 | 10 | 120 |
| 47 | Sn | 50 | 16 | 13 | 79 |
| 48 | Sn | 80 | 20 | 20 | 120 |

FIG. 16
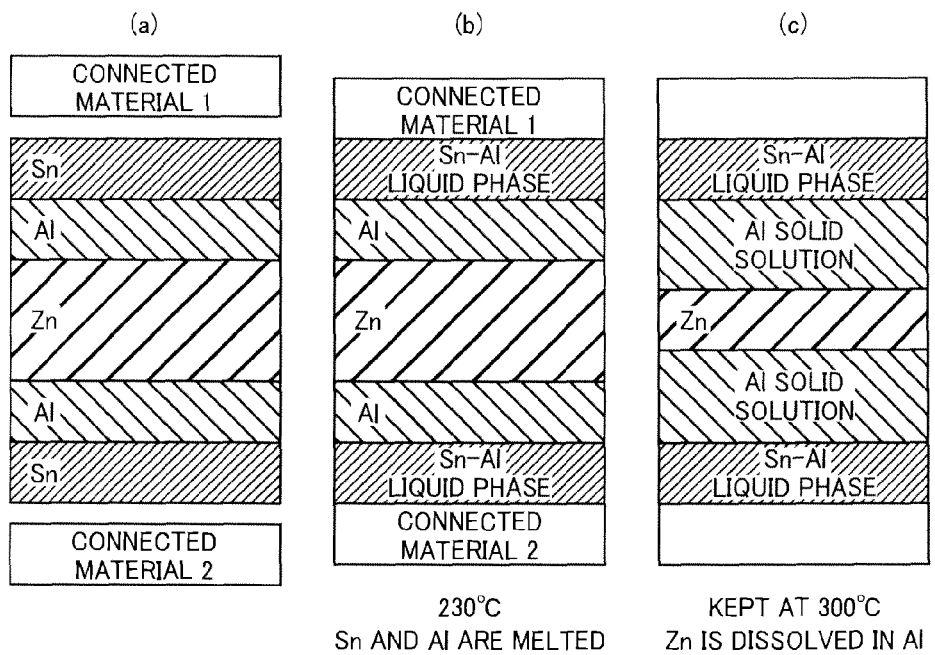
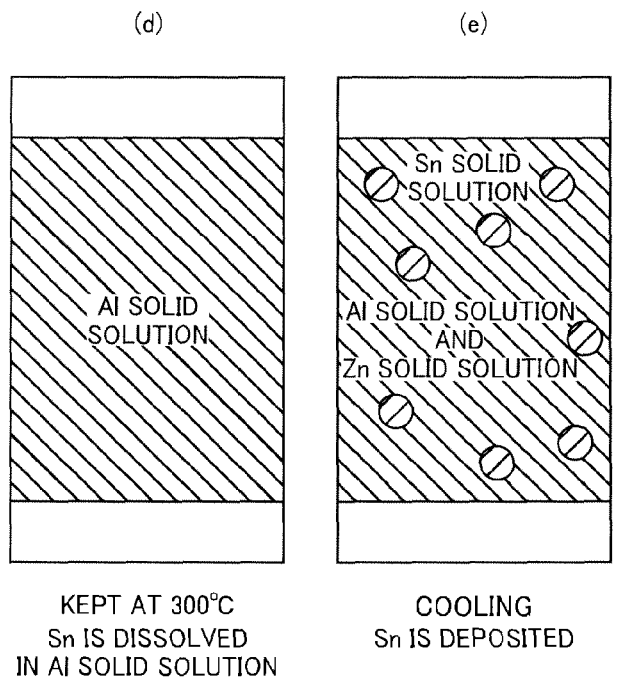

FIG. 19

TABLE 4

| No. | THICKNESS OF EACH LAYER | | | | | TOTAL THICKNESS |
|---|---|---|---|---|---|---|
| | Sn THICKNESS | Al THICKNESS | Zn THICKNESS | Al THICKNESS | Sn THICKNESS | |
| 49 | 5 | 25 | 50 | 25 | 5 | 110 |
| 51 | 5 | 12 | 26 | 12 | 5 | 60 |
| 50 | 5 | 10 | 10 | 10 | 5 | 40 |
| 52 | 10 | 10 | 10 | 10 | 10 | 50 |
| 53 | 10 | 20 | 20 | 20 | 10 | 80 |
| 54 | 10 | 30 | 30 | 30 | 10 | 110 |
| 55 | 1 | 10 | 10 | 10 | 1 | 32 |
| 56 | 10 | 15 | 5 | 15 | 10 | 55 |
| 57 | 10 | 30 | 10 | 30 | 10 | 90 |

JUNCTION MATERIAL, MANUFACTURING METHOD THEREOF, AND MANUFACTURING METHOD OF JUNCTION STRUCTURE

TECHNICAL FIELD

The present invention relates to a junction material and a manufacturing method thereof, and further to a manufacturing method of junction structure using the junction material.

BACKGROUND ART

Along with growing environmental awareness, control on lead that is remarked as being harmful to human bodies has been launched. In Europe, ELV directive (End-of Life Vehicles directive) for limiting use of lead in the vehicle, and RoHS (Restriction of the use of certain Hazardous Substances in electrical and electronic equipment) directive for inhibiting use of lead in electrical and electronic equipment have been put into effect. Generally, solder as the junction material used for electrically coupling parts for electrical and electronic equipment contains lead. The solder is classified into three types, that is, high-temperature solder, intermediate-temperature solder and low-temperature solder in terms of melting point. The intermediate-temperature solder has been developed and put into practical use as Sn—Ag—Cu-base solder and Sn—Cu-base solder. The low-temperature solder has also been developed and put into practical use as Sn—Bi-base solder, and Sn—In-base solder. Those types of solder have been adapted to comply with the ELV and RoHS directives. Meanwhile, the high-temperature solder as high leaded solder contains lead by 85 wt. % or more. The lead-free material as the one alternate to the high leaded solder has not been developed yet, which has been out of the control of ELV and RoHS directives. The high leaded solder contains lead by 85 wt. % or more which may place burden on the environment greater than the burden placed by the Sn—Pb eutectic solder inhibited under RoHS directive. Development of the substitute material alternate to the high leaded solder has been highly demanded.

FIG. 1 illustrates an example of applying the high heat-resistant connection. FIG. 1 is a sectional view showing structure of a semiconductor apparatus. FIG. 2 is a sectional view for explaining flash resulting from the remelted solder.

Referring to FIG. 1, a semiconductor device 1 is connected onto a frame 2 (die bonding) via a solder (junction material). Inner lead of a lead wire 5 and an electrode of the semiconductor device 1 are wire bonded via a wire 4, which then will be sealed with a sealing resin 6 or inactive gas for manufacturing a semiconductor apparatus 20.

The semiconductor apparatus 20 is subjected to a reflow soldering to a printed board via an Sn—Ag—Cu-based intermediate lead-free solder. The melting point of the Sn—Ag—Cu-base lead-free solder is high at approximately 220° C. In reflow connection, the high leaded solder with melting point equal to or higher than 290° C. is employed for die bonding the semiconductor device 1 so as to prevent remelting of the die bonded portion.

The melting point of the currently developed intermediate lead-free solder such as Sn—Ag—Cu-base solder is approximately 220° C. When it is used for die bonding the semiconductor device 1, the solder will be melted upon re-flow connection of the semiconductor apparatus 20 to the printed board. If the area around the connected portion is molded with resin, when the inner solder is brought into molten state, the volume is expanded to cause flashing as shown in FIG. 2, which is the phenomenon that causes the solder 3 to leak from the interface between the sealing resin 6 and the frame 2. Even if it does not leak, it at least acts to escape. As a result, large void 7 may be generated in the solidified solder, resulting in a defective product. As the prospective alternative material, Au-base solder such as solders of Au—Sn-base, Au—Si-base, Au—Ge-base, Zn-base solder such as Zn-base, Zn—Al-base, and Bi-base solder such as Bi, Bi—Cu, Bi—Ag have been reported.

The Au-base solder contains Au by 80 wt. % or more, which has difficulty in realizing versatility in terms of costs. Additionally, the resultant solder is hard but brittle. The Bi-base solder is hard but brittle, and has the heat conductivity of approximately 9 W/m·K which is lower than that of the existing high-temperature solder. It is therefore difficult to apply the above-described solder to the power semiconductor apparatus and power module which require high radiation performance. The Zn-base solder such as Zn and Zn—Al exhibits high heat conductivity of approximately 100 W/m·K, but is easily oxidized, which may prevent sufficient connection in the atmosphere with high oxygen concentration. As it is relatively hard alloy, there may be the risk of cracking the semiconductor device upon connection.

"Patent Document 1" discloses the connection material which overcomes disadvantages of the Zn—Al-base solder which is hard and unlikely to be wet. In the disclosed method, Zn line, Al line and Zn line are sequentially laminated using the clad material formed by clad rolling. With this method, wettability is ensured by the Zn-base layer on the surface, and stress buffer capability is provided by the soft Al-base layer as the inner layer to ensure junction reliability. Each melting point of Zn and Al is 420° C. and 660° C., respectively. The melting point of Zn—Al eutectic (Zn-6Al) produced through reaction between Zn and Al is 382° C. The junction material with high melting point provides high heat-resistant property.

PRIOR ART DOCUMENTS

Patent Documents

Patent Document 1: Japanese Unexamined Patent Publication No. 2008-126272
Patent Document 2: Japanese Unexamined Patent Publication No. 2009-125753

SUMMARY OF THE INVENTION

Problems to be Solved by the Invention

According to the technology as disclosed in "Patent Document 1", Zn line, Al line, and Zn line are sequentially laminated and connected using the clad material through clad rolling. The Al, which is easily oxidized, is protected with Zn which is less oxidizable to ensure wettability as property of the solder while suppressing oxidization of Al. Zn is provided on the outermost surface with an oxide film.

The oxide film of Zn cannot be removed by reduction even in hydrogen atmosphere. If the semiconductor device is connected in the presence of the oxide film, the oxide film resides in the connected portion. This may deteriorate the mechanical strength and interfere with heat conduction, resulting in the risk of deteriorating reliability of the semiconductor device. In order to provide sufficient connection, the initial Zn oxide film has to be removed in the plasma cleaning process so that connection is performed in the atmosphere where the oxygen concentration is kept low.

In this case, excessive Zn oxidization is suppressed, thus allowing connection with high reliability. However, the junction apparatus for suppressing low oxygen concentration requires time for vacuuming, thus deteriorating mass-producibility of the power semiconductor package as well as complicated plasma cleaning process.

"Patent Document 1" discloses the structure formed by cladding Zn and Al with a metal cap, that is, the metal cap/Al/Zn structure. This structure still requires the oxygen concentration to be kept low.

"Patent Document 2" discloses that the easily reducible metal such as Cu is laminated on both surfaces of Zn(—Al)-base solder foil formed of Zn as single body or Zn alloy that contains Zn as main component and Al for forming the structure which suppresses oxidization of Zn and Al. The Zn serves as the metal which allows the easily reducible metal such as Cu to be dissolved during heating. When the Zn(—Al)-base solder foil protected with Cu layer is heated, Cu is dissolved in Zn at a low temperature of approximately 200° C. to expose Zn and Al on the foil surface.

The thus exposed Zn and Al on the surface are quickly oxidized, thus deteriorating wettability and connectivity under the influence of Zn and Al oxide films. In "Patent Document 1", only Zn is exposed. Meanwhile, in "Patent Document 2", Al for forming a rigid oxide film is also exposed, thus deteriorating connectivity considerably.

Although the junction material disclosed in "Patent Document 2" is used, connection cannot be sufficiently conducted unless the oxygen concentration in the atmosphere is kept low. In other words, even if the easily reducible metal protective film for preventing oxidization of Zn is formed on the surface of the Zn-base solder formed of Zn or Zn alloy, its protection effect may be lost as the easily reducible metal is dissolved in Zn owing to low temperature heating at approximately 200° C. This may cause the problem of failing to prevent oxidization of Zn and Al.

The present invention provides a junction material having improved connectivity and connection reliability, and a method of manufacturing a semiconductor apparatus using the junction material.

Means for Solving the Problems

Exemplary structures according to the present invention will be briefly described as below.
(1) A junction material is formed by laminating a first Al-base layer and a first X-base layer in this order on a first main surface of a Zn-base layer. The X-base layer is formed with a main component selected from Cu, Au, Ag and Sn.
(2) In a manufacturing method of junction structure, a first connected member and a second connected member are connected by heating the junction material as described in (1) placed between the first and the second connected members.

Effect of the Invention

The present invention is capable of preventing oxidization of the junction material, and further performing the connection with high reliability in the atmosphere in the presence of oxygen.

The present invention is capable of reducing the void ratio of the junction structure using the junction material according to the present invention to 10% or less, thus ensuring sufficient junction strength. The void ratio is defined as being obtained by dividing the total area of the void 7 by the area of the solder 3 in the planar direction thereof as the connected portion.

BRIEF DESCRIPTION OF THE DRAWINGS

FIG. 11 represents Table 1 showing exemplary structures of the junction material according to the present invention.
FIG. 12 represents Table 2 showing evaluation results of the junction materials in comparison with the laminated material and comparative material shown in Table 1 after conducting a wettability test and a connectivity test.
FIG. 13 represents Table 3 showing exemplary structure of the junction material of the metal plate integrated with the junction material according to the present invention.
FIG. 16 show respective phases of connection of the five-layer laminated material of Sn/Al/Zn/Al/Sn which is kept heated at the temperature ranging from 275° C. to 365° C. according to an embodiment of the present invention.
FIG. 19 represents Table 4 showing exemplary structures of the junction material according to the present invention.

MODE FOR CARRYING OUT THE INVENTION

Figure 1:
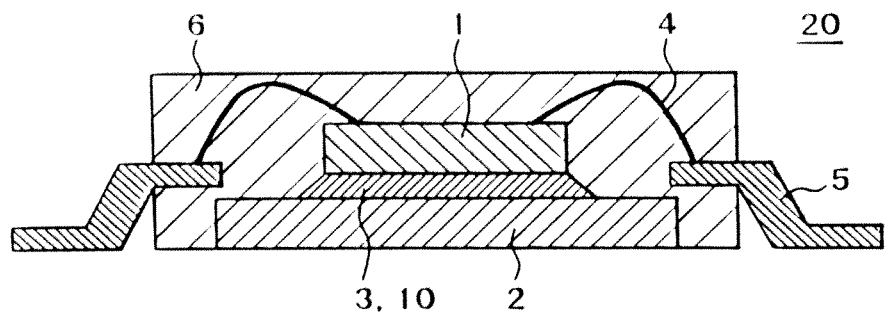
FIG. 1 illustrates a structure of a semiconductor apparatus.
Figure 2:
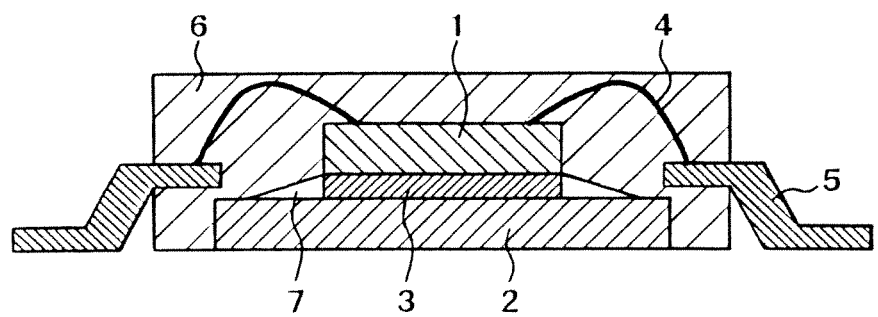
FIG. 2 is a view for explaining flash caused by the remelted solder and void formed by the flash in the semiconductor apparatus shown in FIG. 1.

An embodiment of the present invention will be described in detail referring to the drawings. All through the drawings, the same components will be designated with the same reference numerals, and repetitive explanation of those components, thus, will be omitted.

Figure 4:
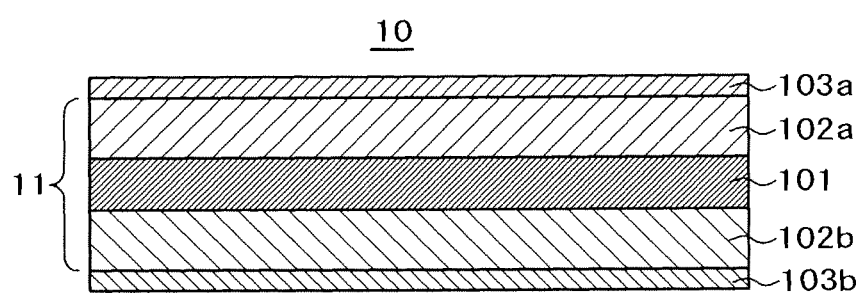
FIG. 4 is a sectional view of the junction material having five layers laminated according to an embodiment of the present invention.

FIG. 4 is a sectional view of a junction material according to an embodiment of the present invention. Referring to FIG. 4, the junction material is a laminated material with a laminated structure including a Zn-base metal layer 101 (also simply referred to as Zn, and Zn-base layer) at the center, Al-base metal layers 102a, 102b (also simply referred to as Al, Al-base layer) laminated on both surfaces of the Zn-base layer, and X-base metal layers 103a, 103b (X=Cu, Au, Ag, Sn) (also simply referred to as X, X-base layer) laminated on both surfaces of the Al-base layers. Preferably, the Al-base layer is the layer formed of a main component of Al (the largest content) by 90 wt. % or more. Conversely, it is preferable to use the Al alloy (single component is available as well) having impurities by 10 wt. % or less. Preferably, the Zn-base layer is the layer formed of a main component of Zn by 90 wt. % or more. Conversely, it is preferable to use the Zn alloy (single component is available as well) having impurities by 10 wt. % or less. The X-base layer is a single layer or alloy layer with a main component of any one of Cu, Au, Ag and Sn. In other words, the X-base layer contains any one of Cu, Au, Ag, and Sn by 90 wt. % or more.

A basic principle of the junction material using the laminated material of X/Al/Zn/Al/X will be described. Firstly, the laminated material is interposed between the connected materials and heated. When the temperature of the laminated material exceeds 380° C., eutectic-melting reaction occurs at the Zn/Al interface of the laminated material to melt Zn and Al for forming Zn—Al melt. The X in the outermost layer is dissolved in the Zn—Al melt so as to melt the entire laminated layer material. Then the Zn—Al—X melt is reacted with the connected material for connection.

The X in the outermost layer serves as the protective layer for preventing oxidization of Al and Zn. Such metals as Cu, Au, Ag and Sn are easily reducible, and accordingly, they are selected as the X-base metal layer. The easily reducible metal denotes the metal capable of easily removing its oxide film in the reducing atmosphere in the presence of hydrogen, and easily removing the oxide film by conducting such process as flux and plasma cleaning. In reference to "Metal data book" edited by Japan Institute of Metals, 2nd revision, Maruzen, p. 90, such metal serves as the index indicating how easily the element is oxidized. Relationship among those elements with respect to the standard free energy of formation will be expressed as Au>Ag>Cu>Sn>Zn>Al (the smaller the energy becomes, the easier it is likely to be oxidized). That is, each of Zn and Al has very low standard free energy of formation for oxide, and accordingly, they are easily oxidized. Those elements of Zn and Al may be protected with the metal having higher standard free energy for formation than Zn and Al, that is, X (Au, Ag, Cu, Sn) so as to prevent oxidization of Zn and Al.

The present invention is structured using feature that X is less soluble in Al than in Zn. For example, a diffusion coefficient as the index of solubility is calculated in reference to "Metal data book" edited by Japan Institute of Metals, 2nd revision, Maruzen, pp. 24-29. Diffusion coefficients of Cu, Au, Ag and Sn which dissolve in Zn at 380° C. are $2.6 \times 10^{-14}$, $1.2 \times 10^{-14}$, $6.0 \times 10^{-14}$, $1.2 \times 10^{-14}$ m$^2$/s, respectively. Meanwhile, diffusion coefficients of Cu Au Ag and Sn which dissolve in Al are $1.2 \times 10^{-15}$, $4.2 \times 10^{-15}$, $6.1 \times 10^{-15}$, and $5.4 \times 10^{-18}$ m$^2$/s, respectively. The diffusion coefficients in Al are smaller than the values in the case of Zn by the amount corresponding to the single-digit figure. This theoretically indicates that any one of Cu, Au, Ag and Sn is less soluble in Al than in Zn.

When heating the X/Zn—Al alloy/X laminated material, the X is rapidly dissolved in Zn to expose Zn and Al on the surface. In the case of X/Al/Zn/Al/X laminated material, it is experimentally recognized that X is hardly dissolved in Al. Accordingly, the X-base metal layer serves to constantly protect the Al/Zn/Al laminated material surface from the timing of heating the X/Al/Zn/Al/X laminated material up to the temperature higher than 380° C. to the moment when the laminated material is entirely melted. The structure according to the present invention allows the X-base layer to suppress oxidization of Zn and Al. This makes it possible to keep good wettability of the X/Al/Zn/Al/X laminated material in the atmosphere in the presence of oxygen at high concentration, resulting in excellent performance as the junction material. When using the material for junction the semiconductor device, the connection may be made while hardly causing the void.

Referring to FIG. 4, preferably, each content of Zn in the Zn-base layer, Al in the Al-base layer, and X in the X-base layer is in the range from 90 wt. % to 100 wt. %, respectively. Each content of Zn, Al and X is controlled to be 90 wt. % or more for preventing an increase in the fusing temperature owing to impurity elements.

For example, in the case where Mn is contained as the impurity element, in spite of a slight decrease in the melting point, the connection layer is hardened, which causes a crack in the semiconductor device. If each content of such elements as Ga, Ge, Mg, In, Sn, and Cu is 10 wt. % or smaller, the melting temperature may be lowered. In this case, the semiconductor device is unlikely to be cracked. This allows the use of alloy mixed at the ratio of 10 wt. % or less.

The junction material of X/Al/Zn/Al/X according to the present invention may be produced by conducting clad rolling or one combined with plating or deposition method. The order of applying the respective methods hardly affects the performance of the laminated material as solder. As described later, the X-base layer is relatively thinner than the Zn-base layer and Al-base layer. Therefore, preferably, the Zn-base layer and the Al-base layer are laminated through the clad rolling suitable for producing the thick film. The Al-base layer and the X-base layer may be laminated not only by the clad rolling method but also by the plating or deposition method which allows the thin film forming. Specific example of the manufacturing will be described.

Figure 5:
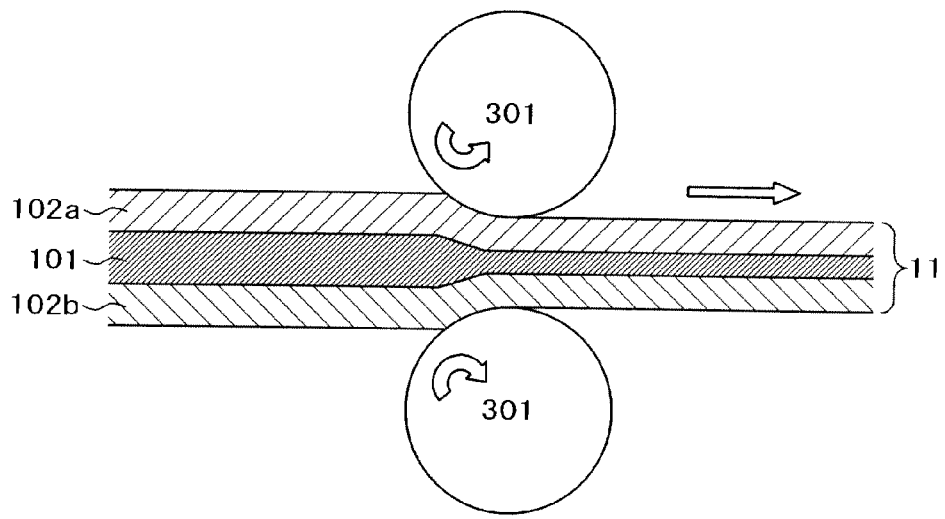
FIG. 5 is a view for explaining clad rolling through which an Al/Zn/Al three-layer laminated structure is formed according to an embodiment of the present invention.
Figure 6:
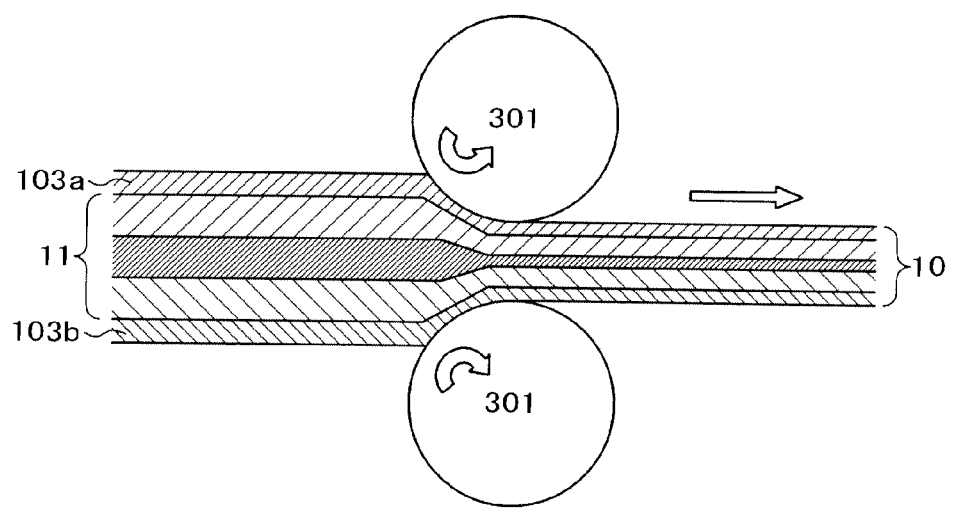
FIG. 6 is a view for explaining clad rolling through which a three-layer laminated material and X-base metal lines are formed into a five-layer laminated material of X/Al/Zn/Al/X according to an embodiment of the present invention.

For example, referring to FIG. 5, two Al-base layers 102a, 102b are provided to interpose the Zn-base layer 101 to form an Al/Zn/Al laminated material 11 through the clad rolling. Then as FIG. 6 shows, X-base layers 103a, the resultant laminated material 11 formed of the Al/Zn/Al, and X-base layer 103b are laminated and subjected to clad rolling to form an X/Al/Zn/Al/X laminated layer 10.

Figure 7:
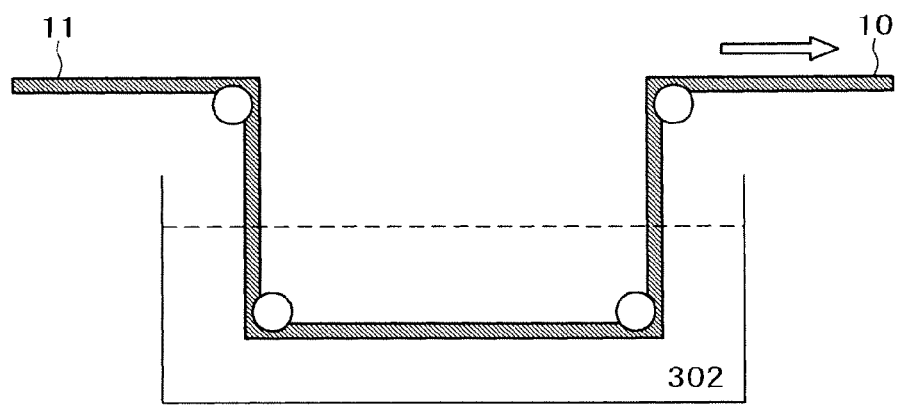
FIG. 7 is a view for explaining a plating process for forming the five-layer laminated material of X/Al/Zn/Al/Z by plating the three-layer laminated material with X-base metal according to an embodiment of the present invention.

The Al/Zn/Al laminated material 11 formed through clad rolling is submerged in a plating bath 302 as shown in FIG. 7 to form an X-base plating layer 103 on the Al surface so as to manufacture the X/Al/Zn/Al/X laminated material 10. Preferably, the Al surface is subjected to X-base plating after replacement of Zn through zincate treatment. The zincate treatment denotes the process for replacing the oxide formed on the Al surface with Zn. The zincate treatment removes the Zn formed on the Al surface in the plating bath.

Figure 8:
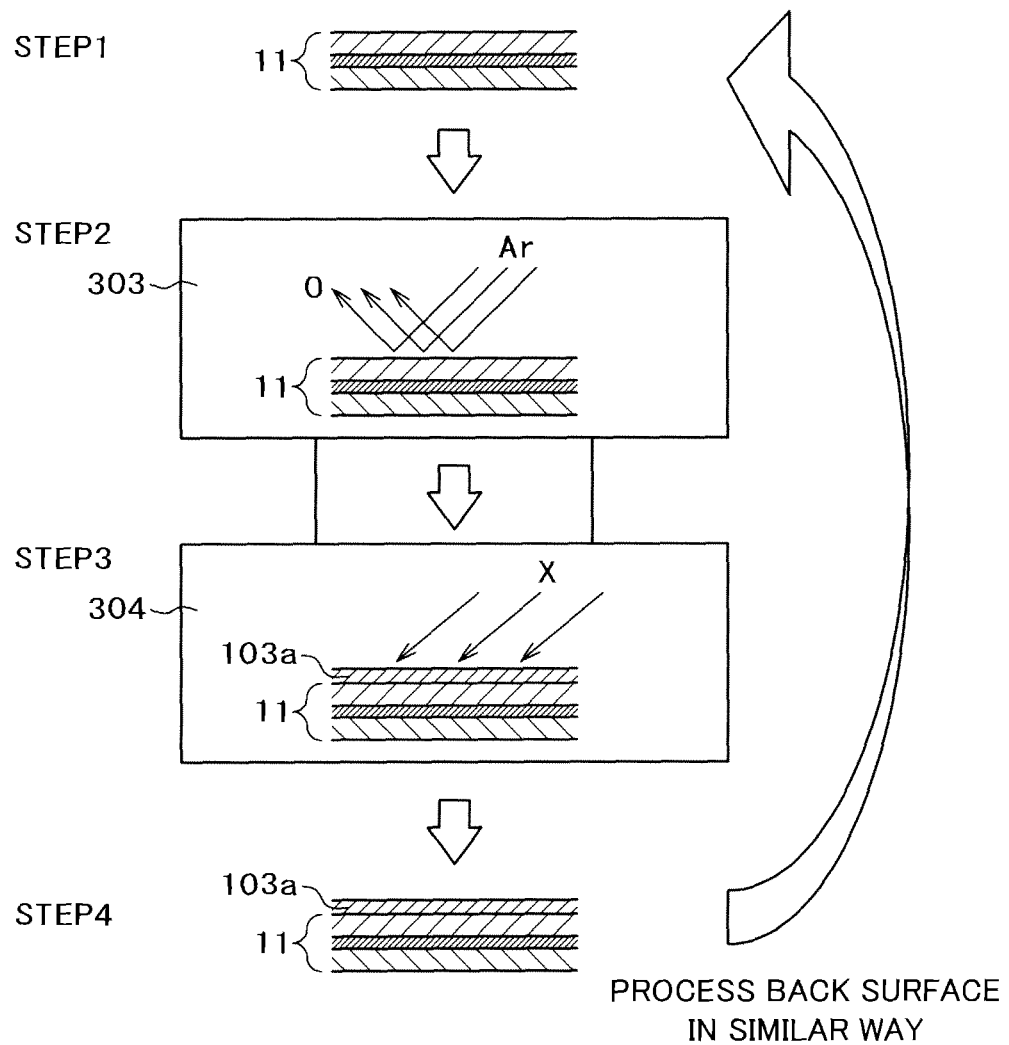
FIG. 8 is a view for explaining a process for removing the oxide film by sputtering the three-layer laminated material and a process for forming a film by depositing the X-base metal for forming the five-layer laminated material of X/Al/Zn/Al/X according to an embodiment of the present invention.

Referring to FIG. 8, instead of conducting the plating, the Al oxide film on the Al/Zn/Al laminated material 11 is removed by sputtering in vacuum, and the X is deposited to form the X-base layer so as to manufacture the X/Al/Zn/Al/X laminated material 10.

In addition, the Al-base layer and the X-base layer are connected to form an X/Al laminated material through clad rolling, plating or deposition method, and then the X/Al laminated material, Zn-base layer and X/Al laminated material are further laminated, which are subjected to clad rolling to form the X/Al/Zn/Al/X laminated material 10. Likewise, it may be that the X/Al laminated material, Al/Zn/Al laminated material, and X/Al laminated material are laminated, which are subjected to clad rolling. In lamination of the X-base layer to the Al-base layer through plating, the X layers may be provided to interpose the Al-base layer so as to form the X/Al/X laminated material. In this case, the X/Al/X laminated material, the Zn-base layer and the X/Al/X laminated material are laminated, which are subjected to rolling to form the X/Al/X/Zn/X/Al/X laminated material. The inner X is dissolved in the Zn-base layer inside, and accordingly, no problem occurs.

The X-base, Al-base and Zn-base layers are laminated and connected through clad rolling to form the X/Al/Zn laminated material. Then the X/Al/Zn laminated materials are further laminated having each Zn-base layer facing with each other, which are subjected to clad rolling to form the X/Al/Zn/Al/X laminated material. In other words, on one side of the first Zn-base layer, the first Al-base layer and the first X-base layer with a main component selected from Cu, AU, Ag and Sn are laminated in this order to form the first clad material. On one side of the second Zn-base layer, the second Al-base layer and the second X-base layer with a main component selected from Cu, Au, Ag and Sn are laminated in this order to form the second clad material. The other sides of the first and the second Zn-base layers are subjected to clad rolling to form the junction material.

The Z-base layer may be interposed between the X/Al/Zn laminated layers, that is, the X/Al/Zn laminated layer, the Zn-base layer, and the X/Al/Zn laminated layer are laminated and subjected to clad rolling to form the X/Al/Zn/Al/X laminated material 10.

On one side of the first Al-base layer, the first X-base layer as the metal with a main component selected from Cu, Au, Ag and Sn is laminated to form the first clad material. On one side of the second Al-base layer, the second X-base layer as the metal with a main component selected from Cu, Au, Ag and Sn is laminated to form the second clad material. The Zn-base layer is interposed between the first and second Al-base layers of the first and second clad materials, which is subjected to clad rolling to form the junction material.

The X-base, Al-base, Zn-base, Al-base, and X-base layers may be laminated and subjected to clad rolling at a time without dividing clad rolling into a plurality of stages.

The X/Al/Zn/Al/X laminated structure 10 may be formed through various processes irrespective of laminating method and laminating order. Differences in the laminating methods reflect the crystal particle sizes of the metal, and residual state of a natural oxide film, which may hardly influence the laminated material serving as the solder. Therefore the material suitable for the solder may be produced using any of the aforementioned methods. Cold rolling and cleaning may be incorporated into the series of the aforementioned process steps so as to be conducted an appropriate number of times for adjusting total thickness of the laminated material. When clad rolling is performed, preferably, the total thickness of the clad rolled laminated material is reduced to be half or smaller than the total thickness of the plate material before processing in consideration of the adhesion degree between layers.

Supposing that Cu or Au is selected for forming the X layer, and the condition for manufacturing the X/Al/Zn/Al/X laminated material is subjected to appropriate adjustment, Cu—Al and Al—Au intermetallic compounds may be produced between the X and Al-base layers. The term "appropriate adjustment" of the manufacturing condition denotes incorporation of the process in which the interface between the X and Al-base layers is heated. Specifically, the interface between the X and Al-base layers is heated for forming the X/Al/Zn/Al/X laminated material through rolling. An increase in the rolling ratio significantly raises the interface temperature. The intermetallic compound is likely to be produced when the interface temperature rises up to approximately 200° C. owing to rolling. Meanwhile, rise in the interface temperature or formation of the intermetallic compound cannot be expected from deposition or sputtering for forming the X layer.

Figure 15:
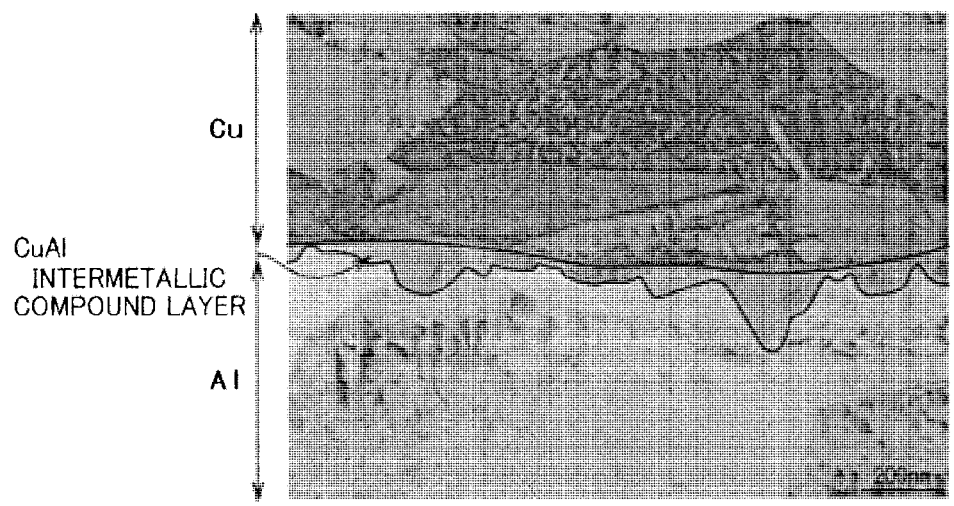
FIG. 15 is a sectional view representing a state where the CuAl-base intermetallic compound layer is formed between the Cu layer and Al layer.

FIG. 15 shows a TEM image of the Cu—Al intermetallic compound formed in the Cu/Al interface when the X layer is mainly formed of Cu. The thus formed intermetallic compound with a thickness of approximately 10 to 300 nm in the X/Al interface serves as a barrier which prevents dispersion of X and Al. Compared to the case of no such compound layer, it is capable of preventing the phenomenon that exposes Al from the surface under the prolonged heating condition at a high temperature. The Cu—Al compound is easily dissolved in Zn—Al in molten state, which never interferes with the connection.

Preferably, the total thickness of the X/Al/Zn/Al/X laminated material is equal to or larger than 20 μm for improving wettability by causing sufficient liquid phase when it is in molten state. Preferably, the total thickness of the laminated material is equal to or smaller than 300 μm for ensuring reliability by reducing thermal resistance at the connected portion. It is preferable to set the ratio of film thickness of the total film thickness of the Al-base layer to the Zn-base layer to 1/60~1/3, and the ratio of film thickness of the X-base layer to the total film thickness of the Zn-base layer and the Al-base layer to 0.0002/1~0.2/1. Alternatively, proportions of layer thicknesses of Al:Zn:Al need to be set to 1:6:1~1:60:1 for allowing the entire laminated material to be uniformly dissolved at the connection temperature ranging from 382° C. to 240° C. Furthermore, it is more preferable to set Al:Zn:Al to 1:8:1~1:30:1 in consideration of uniformity in the melting organization.

The X-base layer needs to have a thickness equal to or larger than a predetermined thickness in order to function in preventing oxidization of Zn and Al. Meanwhile, the X-base layer is dissolved in the Zn—Al alloy in molten state resulting from reaction between the Zn-base layer and Al-base layer so as to generate Zn—Al—X alloy. Preferably, influence of the X element on hardness and melting point of the Zn—Al alloy is suppressed as much as possible. For this, the X-base layer needs to have its thickness smaller than that of the Zn-base layer and Al-base layer. It is preferable to set the ratio of film thickness of the X-base layer to total film thickness of the Zn-base and Al-base layers to 0.0002/1 to 0.2/1. Alternatively, it is preferable to set the proportion of the layer thickness of (Al+Zn+Al):(X+X) to 1:0.0002~0.2. It is more preferable to set the proportion of (Al+Zn+Al):(X+X) to 1:0.0005~0.1.

Die bonding is conducted inside the semiconductor apparatus using the thus produced X/Al/Zn/Al/X laminated material. Referring to FIG. 1 illustrating a semiconductor apparatus 20 formed of a semiconductor device 1, a frame 2 for junction the semiconductor device 1, a lead 5 having one end serving as the outer terminal, a wire 4 for junction the other end of the lead 5 to an electrode of the semiconductor device 1, and a resin 6 for sealing the semiconductor device 1 and the wire 4 with resin, the laminated material 10 with the layer structure of the X/Al/Zn/Al/X as described above is used for forming the junction material 3 which connects the semiconductor device 1 with the frame 2.

The junction temperature is set to 385° C. or higher, the junction time is set to 2 minutes or longer, and the load is set to 0.1 kPa or larger as junction conditions which allow sufficient eutectic melting reaction resulting from interdiffusion of the Zn-base and Al-base layers, and sufficient connection of the entire connection interface. As for the junction atmosphere, $N_2$+4% $H_2$ reducing atmosphere or $N_2$+4% $H_2$+100 ppm$O_2$ reducing atmosphere is set. As a result of connection as described above, the junction structure is formed as the semiconductor device/Zn—Al—X alloy/frame.

Characteristics of the X element will be described. If Cu is selected as X, the laminated material has the structure of Cu/Al/Zn/Al/Cu. When using this laminated material as solder, the semiconductor device and the substrate are connected using the Zn—Al—Cu alloy. The connection may be made in such junction atmosphere as nitrogen atmosphere with low oxygen concentration. It is preferable, however, to conduct the connection in the reduction atmosphere with hydrogen content. In the reduction atmosphere, the natural oxide film on the surface of Cu is reduced by hydrogen upon heating. So the Cu/Al/Zn/Al/Cu laminated material is melted in the absence of oxide membrane. This allows the material to serve as the solder for connection while keeping high wettability. In other words, the highly reliable junction structure with less failure may be realized.

If Au is selected as X, the laminated material has the structure of Au/Al/Zn/Al/Au. When using this laminated material as solder, the semiconductor device and the substrate are connected using the Zn—Al—Au alloy. The Au is the element that generates no oxide, and accordingly, the junction atmosphere may be freely selected from the nitrogen atmosphere, hydrogen atmosphere and the like. In any atmosphere, the Au/Al/Zn/Al/Au laminated material is expected to be melted in the absence of oxide membrane, while serving as the solder with high wettability. In other words, the highly reliable junction structure with less failure may be realized. Since Au is an expensive material, it is preferable to produce the Au/Al/Zn/Al/Au through deposition or plating rather than clad rolling for forming the thin Au layer.

If Ag is selected as X, the laminated material has the structure of Ag/Al/Zn/Al/Ag. When using this laminated material as solder, the semiconductor device and the substrate are connected using the Zn—Al—Ag alloy. The Ag is the metal which generates oxide at room temperature, and becomes reduced by itself in the temperature range at approximately 150° C. or higher, thus decomposing the oxide. Therefore, the junction atmosphere may be freely selected from the nitrogen atmosphere and hydrogen atmosphere. In any atmosphere, the Ag/Al/Zn/Al/Ag laminated material is expected to be melted in the absence of oxide membrane, while serving as the solder with high wettability. In other words, the highly reliable junction structure with less failure may be realized.

If Sn is selected as X, the laminated material has the structure of Sn/Al/Zn/Al/Sn. When using this laminated material as solder, the semiconductor device and the substrate are connected using the Zn—Al—Sn alloy. In this case, the melting behavior of Sn is different from those of Cu, Au, and Ag. Since the melting point of Sn is the lowest among those of the Zn, Al and Sn, Sn is melted at 230° C. upon heating. In other words, the Sn serves to prevent Al from being exposed to the surface in the temperature range from the room temperature to 230° C. At a time point when it begins to melt at 230° C., connection to the connected material is realized. When heating up to approximately 370° C. in the aforementioned state, Zn diffuses in the Al-base layer to reach the Sn/Al interface. The laminated material as a whole is melted as the Zn—Al—Sn alloy so that the semiconductor device and the substrate are connected via the Zn—Al—Sn alloy. Under the effect of Sn, the melting point of the Zn—Al—Sn alloy drops to be lower than that of the Zn—Al alloy. When using Sn, it is preferable to conduct the connection in the nitrogen atmosphere and hydrogen atmosphere with lower oxygen concentration. It is preferable, however, to employ the process for removing the natural oxide film of Sn using flux and plasma cleaning. As the Sn oxide film is removed, the Sn/Al/Zn/Al/Sn laminated material is melted in the absence of the oxide membrane, thus serving as the solder with high wettability for conducting the connection and realizing the highly reliable connected structure with less failure.

In the case of selecting Sn as X, a different junction structure may be obtained by changing the heating method. FIG. 16 are explanatory views with respect to connection. FIG. 16(a) illustrates the state where the Sn/Al/Zn/Al/Sn laminated material and the connected material are prepared. They are connected while being kept at the temperature ranging from 275 to 365° C. for 1 minute or longer. In the example shown in FIG. 16, connection is conducted at the temperature of 300° C. Referring to FIG. 16(b), the Sn/Al/Zn/Al/Sn laminated material is interposed between the connected materials in the state where the temperature is increased up to 230° C. In this state, Sn starts melting first, and the adjacent Al just starts melting in Sn to form the Sn—Al eutectic liquid phase. In other words, in the aforementioned state, the connected materials are connected to the Al/Zn/Al layers interposed therebetween via the Sn—Al eutectic liquid phase. In the state where the temperature is kept at the temperature further increased up to approximately 300° C., Zn diffuses in the Al-base layer so that Al solid solution formed by dissolving Al in Zn is obtained. At this time, the Al becomes the solid solution having Zn dissolved therein by approximately 50 at. %. In the initial state where the temperature is heated at 300° C., the Sn—Al liquid phase layer exists between the Al solid solution and the connected material. This state is represented by FIG. 16(c). As it is further kept at 300° C., Sn and Zn become the solid solution of Al, thus removing the liquid phase layer. The connected material is then connected to the solid solution of Al with the solid phase. This state is represented by FIG. 16(d). Then when cooling thereafter, Sn solid solution, Al solid solution, and Zn solid solution exist in the connected member as shown in FIG. 16(e). FIG. 16 show the case at the temperature of 300° C. However, similar phenomenon may occur in the case where the temperature is in the range from 275 to 365° C.

Figure 17:
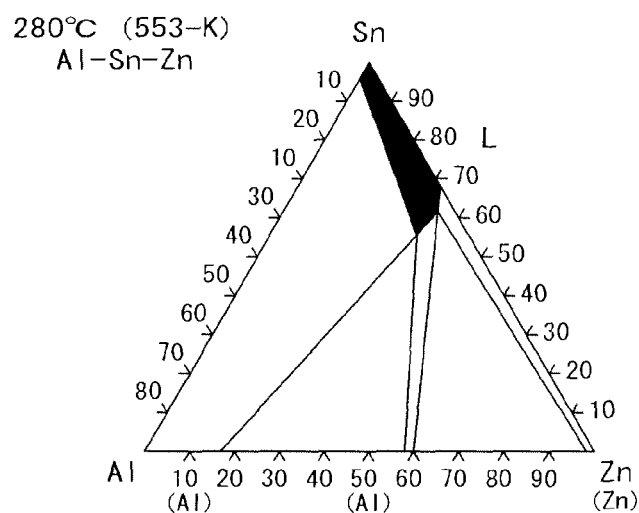
FIG. 17 illustrates a ternary state of Al—Cu—Sn at 280° C.
Figure 18:
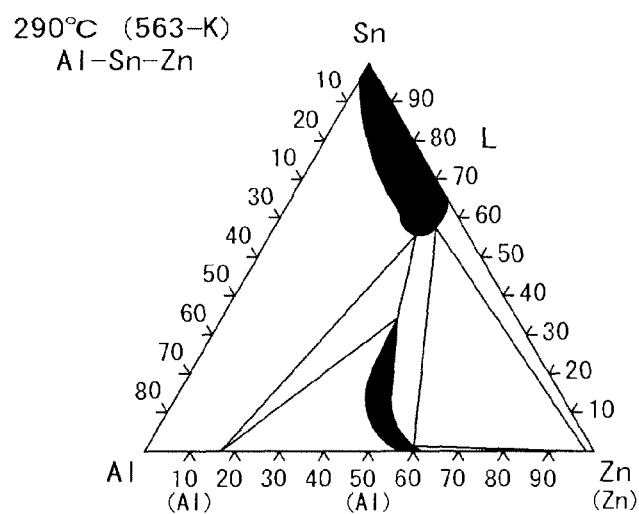
FIG. 18 illustrates a ternary state of Al—Cu—Sn at 290° C.

Referring to Al—Zn—Sn ternary states shown in FIGS. 17 and 18, Sn hardly dissolves in Al solid solution with smaller Zn content, and Zn solid solution. However, approximately 30 at. % of Sn dissolves in Al solid solution with Zn content by 50 at. %. FIGS. 17 and 18 show the respective states at temperatures of 280° C. and 290° C. The aforementioned Al solid solution is generated at 275° C. or higher. That is, Sn—Al liquid phase is lost resulting from diffusion of Sn of the Sn—Al eutectic liquid phase in the Al solid solution layer having Zn dissolved by 50 at. %. At this time point, the connected material is connected via the Al solid solution having Zn and Sn dissolved. In the case where the thickness of the Zn layer is relatively large, Zn layer may be left in the center of the connected layer. After cooling the entire structure, the Al solid solution phase changes into the Al solid solution, Zn solid solution and Sn solid solution, thus terminating the connection.

Compared to the junction method having the entire laminated material melted as described above, this junction method is capable of lowering the junction temperature by up to 100° C., thus reducing the load exerted to the semiconductor device. The present junction method may be conducted at the temperature of 275° C. or higher. However, when the actual junction temperature is set to 290° C. or higher, the content of Sn solid solution in the Al solid solution layer is increased, thus reducing the junction time. The stress of the junction layer may be alleviated by the soft Sn solid solution which deposits in the junction layer, thus improving the junction reliability. It is preferable to set the layer thickness proportion of Al:Zn:Al to 5:1:5~1:2:1 for forming appropriate solid solution.

When Sn is selected as X, addition of Mg is effective for preventing grain boundary corrosion of Zn owing to Sn under the high temperature environment. Therefore Al—Mg alloy and Zn—Mg alloy formed by adding Mg to Al and Zn by up to 10 wt. % may be employed. A seven-layer laminated material of Sn/Al/Zn/Mg/Zn/Al/Sn may be used instead of a five-layer laminated material of Sn/Al/Zn/Al/Sn. It is preferable to set thickness of the Mg layer of the seven-layer structure to $1/10$ or smaller than the total thickness. The aforementioned structure allows a further decrease in the junction temperature and improvement of corrosion resistance. When the added amount and layer thickness of Mg are equal to or larger than the specified values, the Zn—Al—Sn—Mg alloy subsequent to melting is weakened to deteriorate reliability of the junction layer.

A method for manufacturing the semiconductor apparatus will be described. As described above, the semiconductor apparatus is formed of the frame and the semiconductor device using the X/Al/Zn/Al/X laminated material according to the invention as the solder. When heating the X/Al/Zn/Al/X material on the frame into molten state, it becomes Zn—Al—X alloy, thus exposing Zn—Al to the surface. When placing the semiconductor device thereafter, the resultant connection via the oxide film has low reliability. To avoid such connection, the semiconductor device needs to be provided on the laminated material before it is melted. It is preferable to heat the semiconductor device which has been preliminarily placed on the laminated material prior to heating. In the case where the semiconductor device is provided after melting the laminated material, the step for removing the oxide film has to be executed through a scrubbing process, that is, swinging the semiconductor device back and forth and side to side. The connectivity at the frame side becomes better than the case using the Zn—Al alloy solder.

It is preferable to increase the size (longitudinal and lateral dimensions) of the laminated material to be larger than that of the semiconductor device. This makes it possible to realize good connection without exerting the load upon connection, that is, using only its own weight. In the case where the laminated material with the size smaller than the semiconductor device is employed, exertion of the load 0.1 kPa or larger allows the Zn—Al—X alloy to be diffused in wet state over the entire connected surface of the semiconductor device upon melting of the laminated material, resulting in the connection with no problem.

Various kinds of metals, alloys and ceramics, for example, Cu, Al, Ni, Au, Ag, Pt, Pd, Ti, TiN, W, AlN, $Al_2O_3$, AlSiC, and Fe-base alloy such as Fe—Ni and Fe—Co may be used as the material for forming the junction material for the semiconductor device and substrate, and for the surface metallization. The connected material is connected in the state where the intermetallic compound is generated on the interface of the X/Al/Zn/Al/X laminated material resulting from the reaction between those materials. Preferably, the intermetallic compound to be generated hardly grows at high temperatures because growth of the compound leads to deterioration in the mechanical strength, and degrades junction reliability. It is therefore preferable to apply Ni metallization on the surface of the connected material for generating stable compound at a high temperature through reaction with Al and Zn of the Zn—Al—X alloy.

In the case of Ni metallization on the surface of the connected material, oxidization of Ni by itself may cause the problem to interfere with its wettability. The Au, Ag, Pt and Pd which cannot be readily oxidized may be laminated on the Ni. That is, it is preferable to apply metallization of Ni, Ni/Au, and Ni/Ag on the surface of the connected material. The metallization makes it possible to connect the semiconductor device that is formed of arbitrary material including Si, SiC, GaAs, CdTe, and GaN.

The metallization may be applied to the substrate to realize highly reliable connection to any member, for example, the ceramic substrate (insulating substrate) to which such metal as Cu, Al, 42Alloy, CIC (Copper Invar Copper) or DBC (Direct Bond Copper) and DBA (Direct Bond Aluminum) are adhered. Specifically, the structure formed by junction the Ni metallized junction material using a laminated material according to the present invention may be expressed as: connected material/Ni/Ni—Al-base compound/Zn—Al—X alloy/Ni—Al-base compound/Ni/connected material.

Connection of the semiconductor device to the substrate has been described as above. The structure may be applied to connection between the semiconductor and the lead, semiconductor and radiation substrate, the semiconductor and frame, the semiconductor and insulating substrate, or the semiconductor and general electrode. The aforementioned structure may be applied not only to the connection between the semiconductor device and the substrate but also connection between the first and the second connected members using the junction material according to the embodiment. For example, it may be applied to the connection between metal plates, and the metal plate and ceramic substrate.

Alternatively, the structure integrated with the junction material may be obtained by integrating the laminated material according to the present invention with the connected material through clad rolling. Specifically, the X/Al/Zn/Al/X laminated material 10 may be connected to a connected material 121 such as the metal substrate (frame), the ceramic substrate to which metal is adhered, the metal cap and the radiation substrate. The connected material 121 needs to be characterized not to be melted at the temperature at which eutectic alloy of Zn and Al is generated. It is therefore preferable to set the lowest melting temperature of the component to 390° C. or higher. The connected material 121 may be selected from the Fe-base alloy, Al-base alloy, Cu-base alloy and the like.

Figure 9:
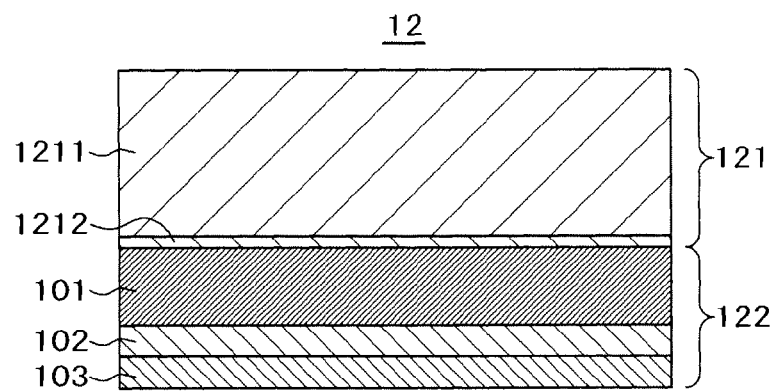
FIG. 9 is a sectional view of a metal plate integrated with a junction material having the metal plate to be connected and a Zn/Al/X laminated material connected according to an embodiment of the present invention.

When supplying the structure integrated with the junction material, it does not need to be structured as the connected material/X/Al/Zn/Al/X but may be a connected material/Zn/Al/X structure 12 as shown in FIG. 9. It is preferable to apply metallization 1212 such as the Ni, Ni/Au, and Ni/Ag as described above on the connected material surface. For example, if Ni metallization is applied, the connected base material/Ni/Zn/Al/X structure may be obtained. When heating the structure 12, the Zn—Al alloy is melted at 382° C. or higher, and X is dissolved in the melted alloy. The stable intermetallic compound is formed by the Al of the Zn—Al—X alloy and Ni of the metallization 1212 to prevent a connected base material 1211 from dissolving in the junction member.

Integration of the laminated material may omit the process for setting the junction material when junction. In the structure, the natural oxide film of X is reduced by the reducing gas such as hydrogen, and cannot be easily diffused in the Al-base layer, thus preventing oxidation of Al. In the case of the structure integrated with the junction material as the connected material/Zn/Al/X structure 12 as shown in FIG. 9, it is preferable to set the proportion of the layer thickness of Zn:Al to 3:1~60:1. It is further preferable to set the proportion of the film thickness of (Zn+Al):X to 1:0.0001~0.1.

The three-layer structure such as Zn/Al/X may be used for forming the junction material employed to form the material integrated with the junction material as shown in FIG. 9 instead of using the five-layer material as shown in FIG. 4. The surface at the Zn layer side of the three-layer structure may be clad connected to the metal plate.

Figure 10:
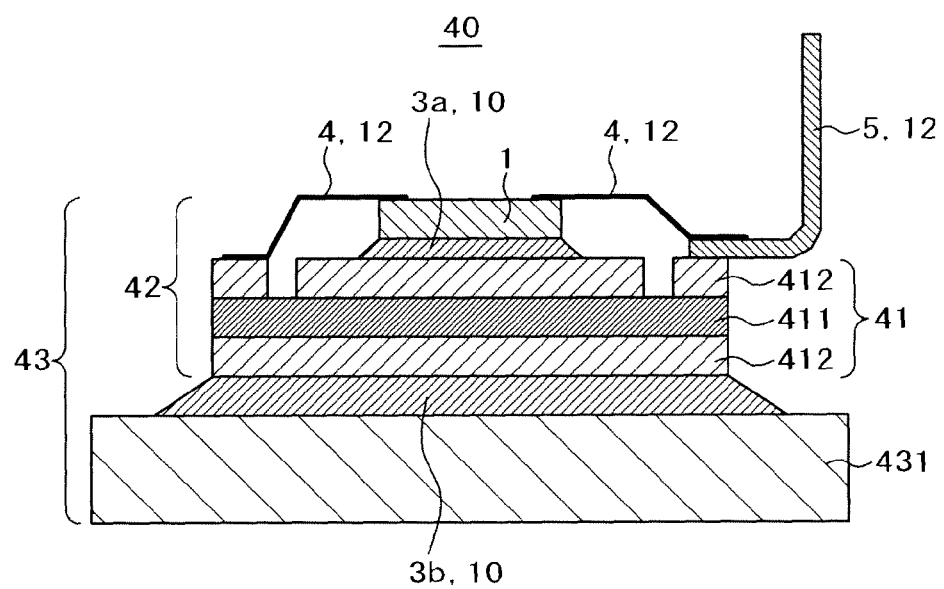
FIG. 10 is a view for explaining the structure of the semiconductor apparatus (semiconductor module) according to an embodiment of the present invention.

The junction portions of the semiconductor module required to exhibit high strength, high heat resistance, and high heat conductivity may be connected using the laminated material according to the present invention and the metal plate integrated with the junction material. That is, a semiconductor module 40 as shown in FIG. 10 may be produced. The semiconductor device 1 and an insulation substrate 41 are connected using the laminated material 10 according to the present invention (or junction the semiconductor device 1 with the junction material integrated insulating substrate 12) to connect the insulating substrate 41 with a radiation metal substrate 431 using the laminating film 10 (or integrating the insulating substrate 41 with the junction material integrated radiation metal substrate 12).

As an alternative to the wire 4, the junction material integrated metal sheet 12 is used to connect the electrode on the surface of the semiconductor device to the insulating substrate 41 and the lead 5 serving as the inner or outer terminal. The lead 5 serves as the junction material integrated lead 12 according to the present invention, which is not connected to the insulating substrate 41 through soldering and ultrasonic bonding. The junction material portion may be locally heated for conducting the connection. Such structure realizes the highly reliable semiconductor module 40 while having a melting point at all the junction portions in excess of 300° C.

The laminated material according to the present invention is not limited to the plate structure but may be formed into the concentric wire structure. It may be structured to use the Zn wire as the core material, and to laminate the Al-base layer on the outer circumference and X-base layer provided on the outermost circumference. This makes it possible to provide oxidation resistance performance that is similar to the plate laminated material as described below.

Examples 1 to 24

The laminated materials according to the present invention used for the following examples are formed of the material prepared using clad rolling, plating, or deposition. An example of the produced clad material is shown in FIG. 11 (Table 1). The laminated materials of Zn/Al/Zn and Cu/Zn—Al/Cu are used to be compared with the laminated material according to the present invention. The Zn/Al/Zn laminated material is manufactured using the clad rolling of Zn, Al and Zn. The Cu/Zn—Al/Cu laminated material is manufactured by clad rolling of Cu, Zn—Al alloy, and Cu. The structure may be manufactured using a method other than the clad rolling, which provides the characteristics of the material serving as solder, resulting in the equivalent connectivity.

Examples 1 to 24 are subjected to a wettability test and examination with respect to connectivity of laminated materials 1 to 24 as represented by FIG. 11 (Table 1). The results are summarized by FIG. 12 (Table 2). The wettability test is conducted by placing the respective laminated materials on the Cu/Ni/Au substrate, which are left at the heating temperature of 385° C. for 3 minutes in the $N_2$ atmosphere so that the behavior of the X-base layer and spreading in wet state upon heating are examined.

If the material has the X-base layer resided in the outermost layer until melting, it is evaluated as good (O) If the material has the X-base layer dissolved in Zn and Al and further lost during heating, it is evaluated as no good (x). If the X-base layer is lost, this means that Zn and Al are oxidized, and accordingly, the material is regarded as being unsuitable for the junction material. Visual determination is made whether or not the X-base layer has been lost.

If the material has the melted metal spread in wet state on the substrate, it is evaluated as good (O). If the material has the melted metal not spread in wet state, it is evaluated as no good (x). The junction material is required to spread in wet state. In the case where the melted metal is spread in wet state and the resultant area of melting becomes larger than the original area of the metal in solid state, it is evaluated as good (O). Meanwhile, if the melted area is smaller than the original area in solid state, it is evaluated as no good (x).

Connectivity has been evaluated by subjecting the respective materials to die bonding on the semiconductor device 1 as shown in FIG. 1 for evaluation. The semiconductor apparatus 20 includes the semiconductor device 1, the frame 2 for junction the semiconductor device 1, the lead 5 having one end serving as the outer terminal, the wire 4 for junction the other end of the lead 5 to the electrode of the semiconductor device 1, and the sealing resin 6 for sealing the semiconductor device 1 and the wire 4 with resin. The semiconductor device 1 and the frame 2 are connected using the junction material 10 (laminated material with the structure of X/Al/Zn/Al/X).

When manufacturing the semiconductor apparatus 20, the junction materials 10 (laminated material of Zn/X/Al/X/Zn) formed into square (5.5 mm×5.5 mm) are provided on the Cu frame 2 coated with Ni, Ni/Ag or Ni/Au, and the semiconductor device 1 with size of 5 mm×5 mm is laminated. They are connected under the condition with no load at junction temperature of 385° C. or higher for junction time of 2 minutes or longer in variable atmospheres including $N_2$+10 ppm$O_2$ atmosphere, N+100 ppm$O_2$ atmosphere, $N_2$+4% $H_2$+10 ppm$O_2$ reducing atmosphere and N+4% H+100 ppm$O_2$ reducing atmosphere using corresponding gas in the heat.

Figure 3:
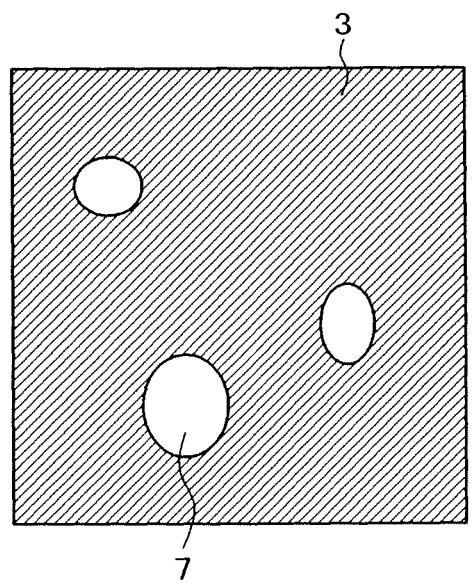
FIG. 3 is a plan view illustrating a connected portion, which defines the void ratio.

After connection, wire bonding is conducted between the semiconductor device 1 and the lead 5 using the wire 4 and sealing is performed using the sealing resin 6 at 180° C. The void area ratio at the connected portion of the thus manufactured semiconductor apparatus 20 is measured using an ultrasonic flaw detector. As FIG. 3 shows, the void ratio is obtained by dividing the total area of void 7 in the planar direction of the solder 3 at the connected portion by the area of the connected layer in the planar direction. If the void ratio in the connected layer is equal to or lower than 10% as the general criteria based on which the semiconductor apparatus has predetermined reliability, and the semiconductor device is normally operated, it is evaluated as good (O). Otherwise, it is evaluated as no good (x) If the connectivity is evaluated as good (O) in all the junction atmospheres, it is determined to have the material evaluated as good (O). In the case of the void ratio in excess of 10%, a crack may develop preferentially around the void as it is subjected to the temperature cycle test, thus deteriorating reliability at an earlier stage. The long-term reliability may be ensured by reducing the void ratio as much as possible.

Evaluation results are shown hereinafter. Results of the wettability test show that all the laminated materials Nos. 1 to 24 show spread in wet state without losing the X-base layer during heating, and accordingly, they are evaluated as good (O). Since the X-base layer is not lost, Al is kept unoxidized until connection, and accordingly, wettability is not deteriorated. As for evaluation results of connectivity, all the materials Nos. 1 to 24 show the void ratio of 10 wt. % or lower, thus indicating good connection. Accordingly, they are evaluated as good (O). More detailed examination reveals that no defect exists, that is, no oxide film is left in the junction layer. The semiconductor device is normally operated without any cracks, thus being evaluated as good (O) for total determination.

Meanwhile, comparative examples 1 and 2 are subjected to a wettability test and examination with respect to connectivity of a Zn/Al/Zn clad material and a Cu/Zn—Al/Cu clad material. The Zn/Al/Zn clad material shows good wettability. It is considered that, in the Zn/Al/Zn clad material, Zn prevents oxidization of Al. It is considered that, in the Cu/Zn—Al/Cu clad material, Cu prevents oxidization of Zn and Al.

The oxide film on the solder surface immediately after melting is observed in both the Zn/Al/Zn clad material and Cu/Zn—Al/Cu clad material. In this case, oxidation is thought to have progressed during heating. The initial Zn oxide film is developed in the Zn/Al/Zn clad material. In the Cu/Zn—Al/Cu clad material, Cu is dissolved in Zn during heating, and Zn exposed to the surface is oxidized.

The semiconductor device with size of 5 mm×5 mm may be connected without causing a crack in the chip. Measurement results of void at the connected portion using an ultrasonic flow detector show that the void ratio of the Zn/Al/Zn clad material is 10% or less in the atmosphere of $N_2+10$ ppm$O_2$. This value indicates good connection and it is evaluated as good (O). The void ratio measured in any other atmosphere results in excess of 10%, and it is evaluated as no good (x).

Meanwhile, in the case of the Cu/Zn—Al/Cu clad material, good connection is obtained with the void ratio of 10% or less in the atmosphere of $N_2$ and $N_2+H_2$ so long as the oxygen concentration is 10 ppm or less, and it is evaluated as good (O). In the atmosphere at the oxygen concentration in excess of 100 ppm, the void ratio exceeds 10%, and it is evaluated as no good (x). This is because Zn and Al are oxidized during heating for connection, and the resultant oxide film is left in the connected layer.

According to the examples 1 to 24, the junction material 10 of the embodiment is used for die bonding of the semiconductor apparatus 20, which allows the X-base metal layer to prevent oxidation of Zn and Al in the junction process. This makes it possible to provide good connection with reduced void not only in the reducing atmosphere at the low oxygen concentration but also in the reducing atmosphere at the oxygen concentration in excess of 100 ppm. In other words, the laminated material according to the present invention serves as the solder material with excellent oxidation resistance.

Example 25

In Example 25, the semiconductor apparatus 20 is manufactured using the laminated materials Nos. 1 to 24 according to the present invention as listed in FIG. 11 (Table 1). Basically the steps are the same as those in Examples 1 to 24 except that the laminated material 10 with size of 4.5 mm×4.5 mm is applied to the semiconductor device with size of 5 mm×5 mm. The load of 0.1 kPa or higher is applied to the device, and it is heated for connection. As results of evaluation in accordance of the criteria similar to those for the examples 1 to 24 show, any of the resultant laminated material Nos. 1 to 24 has the void ratio of 10% or less in any of the atmosphere, resulting in good connection. Use of the material with size smaller than that of the semiconductor device 1 allows the solder material to spread in wet state over the entire surface of the semiconductor device by applying the load during connection.

Example 26

Figure 14:
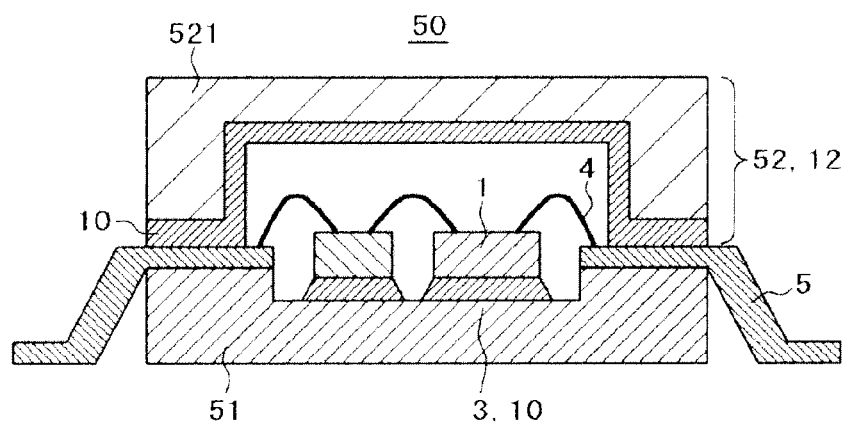
FIG. 14 is a view for explaining a semiconductor apparatus which requires sealing according to an embodiment of the present invention.

In Example 26, the semiconductor apparatus requiring air sealing is manufactured as shown in FIG. 14 using the laminated materials Nos. 25 to 48 as listed in FIG. 13 (Table 3). Specifically, plating 1212 of any of Ni, Ni/Au, and Ni/Ag is applied to a metal plate 1211 (metal cap) as shown in FIG. 9, which is cladded with a Zn/Al/X laminated material 122 so as to manufacture a structure 12 of metal plate/metallization/Zn/Al/X. The laminated materials listed in FIG. 13 (Table 3) show each thickness of Zn, Al and X after junction the metal plate to the Zn/Al/X through clad rolling.

Referring to FIG. 14, the semiconductor device 1 and a module substrate 51 are connected using the laminated materials Nos. 1 to 24, and the semiconductor device 1 is connected to the lead 5 using the wire 4. Thereafter, a metal plate 52 with Zn/Al/X is placed under the condition at the junction temperature ranging from 385° C. to 420° C., for junction time of 2 minutes or longer, with the load of 0.1 kPa in the converted atmospheres including $N_2+10$ ppm$O_2$ atmosphere, $N_2+100$ ppm$O_2$ atmosphere, $N_2+4\%$ $H_2+10$ ppm$O_2$ reducing atmosphere, and N+4% H+100 ppm$O_2$ reducing atmosphere. After converting the respective atmospheres, it is then heated and connected in the vacuum atmosphere. In any of the atmospheres, the resultant void ratio is 10% or less, realizing a highly reliable air sealed structure.

Example 27

In Example 27, the semiconductor apparatus shown in FIG. 1 is manufactured using the junction material integrated metal plate with the structure as listed in FIG. 13 (Table 3). Unlike Examples 1 to 25, the metal plate 1211 (lead frame), Ni layer 1212 and the Zn/Al/X laminated layer 122 are subjected to cladding to manufacture the lead frame 12 provided with the laminated material of the metal plate/Ni/Zn/Al/X structure as shown in FIG. 9. The same effects derived from the Ni layer 1211 may be obtained by plating the metal plate. Each thickness of Zn, Al and X of the laminated materials after junction the metal plate, the Ni and Zn/Al/X through clad rolling is shown in FIG. 13 (Table 3). The Ni layer 1212 functions in preventing excessive development of metallic reaction of Zn, Al with the lead frame base material 1211.

The semiconductor element 1 is set on the thus prepared lead frame 12 with a junction material, which is heated and connected under the condition at the connection temperature of 385° C. or higher, for the junction time of 2 minutes or longer, at the load of 0.1 kPa in the $N_2+10$ ppm$O_2$ atmosphere, $N_2+100$ ppm$O_2$ atmosphere, $N_2+4\%$ $H_2+10$ ppm$O_2$ reducing atmosphere, and $N_2+4\%$ $H_2+100$ ppm$O_2$ reducing atmosphere. In any of the atmospheres, the resultant void ratio is 10% or less, realizing good connection.

Example 28

In Example 28, the semiconductor apparatus which is basically the same as the one shown in FIG. 1 is produced using Examples 1 to 24. Referring to FIG. 1, the semiconductor device 1 and the frame 2 are connected in the same way as performed in Examples 1 to 24, and then the semiconductor device 1 and the lead 5 are connected using a thin plate 12 integrated with the junction material according to the present invention rather than using the wire 4.

Specifically, referring to FIG. 9, the material 12 formed by laminating Ni, Zn, Al, and X lines on the metal plate 1211 formed of Al or Cu through clad rolling, and the material 12 formed by laminating the Zn/Al/X laminated material 122 on the member 121 formed by plating the Cu with Ni through clad rolling are prepared. The thus prepared members 12 are provided on the electrode on the upper surface of the semiconductor device 1 and the lead 5. The material 12 is subjected to spot heating by a laser heating device for locally inducing the Zn—Al eutectic-melting reaction so that the electrode and the lead portion are connected.

It is preferable to use Ni, Ni/Au or Ni/Ag for surface metallizing the electrode and the lead portion. After junction the electrode and the lead portion, the connected structure is molded to provide the semiconductor apparatus 20 as shown in FIG. 1. Each void ratio of the connected portions of the electrode and the lead portion connected using the laminated material according to the present invention results in 10% or less, indicating good connected state. The highly reliable connected portions may be obtained irrespective of the temperature cycle test while keeping the crack development at the corresponding portion at a sufficiently low rate.

Example 29

In Example 29, a semiconductor module 40 shown in FIG. 10 is manufactured. The semiconductor device 1 is connected to a metal adhered ceramic substrate 41 (insulating substrate) using the laminated materials Nos. 1 to 21 as a solder 3a. A radiation metal plate 431 functioning in releasing heat generated when operating the semiconductor device 1 is connected to the insulating substrate 41 using the laminated materials Nos. 22 to 24 according to the present invention as a solder 3b for manufacturing the semiconductor module 40. The structure will be described in more detail hereinafter.

A power module assembly process will be described. The power module is generally manufactured by junction the semiconductor device 1 with the insulating substrate 41 using the solder 3a, and then junction the insulating substrate 41 with the radiation metal plate 431 using a solder 3b. In this case, when the solder 3a for junction the semiconductor device 1 with the insulating substrate 41 is remelted in the heat for junction the insulating substrate 41 with the radiation metal plate 431, reliability of the module may be deteriorated. In order to prevent remelting of the solder 3a, the solder 3b needs to be formed of the material with a lower melting point than that of the solder 3a.

The laminated materials Nos. 1 to 21 each with the melting point which becomes approximately 380° C. after connection are employed as the solder 3a. Then the semiconductor device is connected to the Ni plated insulating substrate 41 of Ni/Cu/Si$_3$N$_4$/Cu/Ni to provide a structure 42 under the condition at the junction temperature of 382° C. or higher, for the retaining period of 2 minutes or longer, at no load in the N$_2$+4% H$_2$ atmosphere. The laminated materials Nos. 22 to 24 are interposed between the Cu/Ni substrate 431 as the radiation metal plate and the structure 42, which are connected under the condition at the junction temperature 370° C., for the retaining time of 2 minutes, with no load in the N$_2$+4% H$_2$ atmosphere to provide a structure 43. The effect of Sn allows the laminated materials Nos. 22 to 24 to conduct connection even if the junction temperature is lowered to 382° C. or lower. Therefore connection may be made without remelting the Zn—Al—X connected portion 10 of the structure 42. The lead 5 is soldered to the thus manufactured structure 43, and the electrode on the upper surface of the semiconductor element 1 and a metal circuit 412 and the lead 5 on the insulating substrate 41 are subjected to bonding with the wire 4 to provide the semiconductor module 40. As results of measurements of the void ratios at the respective connected portions of the semiconductor module 40, such ratio at any of the connected portions is 10% or less, resulting in a highly reliable junction structure.

Example 30

Among the laminated materials listed in FIG. 11, structures No. 2' and No. 14' each having the intermetallic compound layer generated on Cu/Ai interface and Au/Al interface are prepared using the laminated materials Nos. 2 and 14, and using materials with the structures similar to those of the materials Nos. 2 and 14. All the laminated materials are kept at the temperature of 370° C. immediately below the melting point. As a result, each time taken until Cu and Au in the upper layer are lost in the case of the respective laminated materials No. 2, No. 14, No. 2' and No. 14' is 10 minutes, 2 minutes, 20 minutes, and 4 minutes, respectively. In any of the cases, the aforementioned time is sufficient and the upper surface resides in the actual junction process, resulting in no problem in the oxidation resistance. The laminated materials Nos. 2' and 14' used for generating the intermetallic compounds reside in the upper surface for twice as long a time. In the case of an extremely low heating rate, connection may be made without oxidizing Zn and Al. In the case where the laminated materials of Nos. 2' and 14' are heated to 382° C. or higher to melt the laminated material as a whole, the intermetallic compound on the interface is dissolved in Zn—Al, which prevents deterioration in connectivity.

Example 31

The semiconductor device and the frame are connected using the laminated materials of Sn/Al/Zn/Al/Sn as listed in FIG. 19 for manufacturing the semiconductor apparatus 20 shown in FIG. 1 at the junction temperature of 300° C., for retaining time of 5 minutes at the load of 1 kPa in the N; atmosphere. The junction temperature is lower than the Zn—Al eutectic point, but Sn is melted at the low temperature. This makes it possible to connect as well as realize the connected structure with the void ratio equal to or lower than 10%.

Example 32

The laminated materials listed in FIG. 11 are manufactured through clad rolling. The manufactured clad material is processed into a ribbon-like shape with width of 1.0 mm so as to be wound around the reel. The ribbon material is installed in the die bonder, and connected to the lead frame. Specifically, the ribbon-like clad material is brought into contact with the lead frame heated at 382° C. or higher for melting. Then Zn—Al—X solder is supplied onto the lead frame. The solder in molten state is subjected to the process called spank for spreading the solder while being spanked by a rectangular jig. Then the chip is mounted on the solder using a collet. When mounting the chip, the process called scrub is incorporated for vibrating the chip from back and forth and side to side. In this process, the oxygen concentration in the atmosphere is set to 100 ppm or lower, and the growing Zn and Al oxide films by small amounts may be removed by executing the spank and scrub processes. The resultant void ratio becomes 10% or less, providing good connection. Meanwhile, the Zn—Al alloy as the ribbon-like shape is formed to conduct the connection through the same process as a comparative example. However, the initial oxide film of Zn—Al is too rigid to be removed by the process of spanking and scrubbing. Therefore the resultant void ratio at the connected portion exceeds 30%, resulting in connection failure.

An embodiment of the present invention has been described in detail. However, the present invention is not limited to the aforementioned embodiment but may be modified to various forms without deviating from scope of the invention.

In the explanations, die bonding material, wire bonding material, sealing material, and material for junction the insulating substrate are used for the generally configured semiconductor apparatus. However, they may be used as the junction material with various structures. For example, they may be applied to the front end module such as alternator diode, IGBT module, and RF module, power module for automobile, LED, MOSFET for protecting circuit of lithium ion battery, DBC and DBA substrate. They may be applied to the brazing filter metal and brazing sheet for Al alloy as well.

REFERENCE SIGNS LIST 1 semiconductor device
2 frame
3, 3a, 3b solder
4 wire
5 lead
6 sealing resin
7 void
10 X/Al/Zn/Al/X laminated material
101 Zn-base metal layer
102, 102a, 102b Al-base metal layer
103, 103a, 103b X-base metal layer
11 Al/Zn/Al laminated material
12 junction material integrated metal plate
121 metal plate (connected material)
122 Zn/Al/X laminated material
1211 connected material (metal plate)
1212 metallization on connected material surface
20 semiconductor apparatus
301 roller
302 plating bath
303 sputtering device
304 deposition device
40 semiconductor module
41 insulation substrate
411 ceramic plate
412 metal plate on ceramic plate surface
42 connected body of semiconductor device and insulation substrate
43 connected body of semiconductor device and insulation substrate and radiation metal plate
431 radiation metal substrate
50 sealed structure semiconductor apparatus
51 module substrate
52 metal cap with connected material
521 metal cap

The invention claimed is:

1. A junction material of soldering formed by laminating a first Al-base layer formed of a metal with a main component of Al and a first X-base layer in this order on a first main surface of a Zn-base layer formed of a metal with a main component of Zn, wherein the X-base layer is formed of a metal with a main component selected from Cu, Au, Ag and Sn, and
wherein the first main surface of the Zn-base layer directly contacts with the first Al-base layer without melting the first Al-base layer or the Zn-base layer, and
wherein a ratio of (total thickness of the first Al-base layer)/(total thickness of the Zn-base layer) is set to 1/60 to 1/3, and a ratio of (thickness of the first X-base layer)/(total thickness of the Zn-base layer and the first Al-base layer) is set to 0.0002/1 to 0.2/1.

2. The junction material of soldering according to claim 1, wherein a second Al-base layer formed of a metal with a main component of Al and a second X-base layer are laminated in this order on a second main surface opposite the first main surface of the Zn-base layer; and
the second X-base layer is formed of a metal with a main component selected from Cu, Au, Ag and Sn, and
wherein the second main surface of the Zn-base layer directly contacts with the second Al-base layer.

3. The junction material of soldering according to claim 1, wherein a second main surface opposite the first main surface of the Zn-base layer is connected to a substrate.

4. The junction material of soldering according to claim 1, wherein the Zn-base layer is formed of one of a single body layer and an alloy layer with a main component of Zn by 90 to 100 wt. %.

5. The junction material of soldering according to claim 1, wherein one of the first and the second Al-base layers is formed of one of a single body layer and an alloy layer with a main component of Al by 90 to 100 wt. %.

6. The junction material of soldering according to claim 1, wherein one of the first and the second X-base layers is formed of one of a single body layer and an alloy layer with a main component of Cu by 90 to 100 wt. %.

7. The junction material of soldering according to claim 1, wherein one of the first and the second X-base layers is formed of one of a single body layer and an alloy layer with a main component of Au by 90 to 100 wt. %.

8. The junction material of soldering according to claim 1, wherein one of the first and the second X-base layers is formed of one of a single body layer and an alloy layer with a main component of Ag by 90 to 100 wt. %.

9. The junction material of soldering according to claim 1, wherein one of the first and the second X-base layers is formed of one of a single body layer and an alloy layer with a main component of Sn by 90 to 100 wt. %.

10. A manufacturing method of junction material of soldering comprising:
a step of forming a first clad material formed by laminating with cold rolling a first Al-base layer and a first X-base layer formed of a metal with a main component selected from Cu, Au, Ag, and Sn on one surface of a first Zn-base layer in this order, wherein the first Al-base layer directly contacts with the first Zn-base layer without melting the first Al-base layer or the Zn-base layer;
a step of forming a second clad material formed by laminating with cold rolling a second Al-base layer and a second X-base layer formed of a metal with a main component selected from Cu, Au, Ag and Sn on one surface of a second Zn-base layer in this order, wherein the second Al-base layer directly contacts with the second Zn-base layer; and
a step of clad rolling the first clad material and the second clad material with the first Zn-base layer and the second Zn-base layers opposing to each other, and
wherein a ratio of (total thickness of the first Al-base layer)/(total thickness of the first Zn-base layer) is set to 1/60 to 1/3, and a ratio of (thickness of the first X-base layer)/

(total thickness of the first Zn-base layer and the first Al-base layer) is set to 0.0002/1 to 0.2/1.

11. A manufacturing method of junction material of soldering comprising:
  a step of forming a Zn-base layer interposed between a first Al-base layer of a first clad material . . . second Al-base material to clad rolling, wherein
  a side opposing to the one side of the first Al-base layer directly contacts with a first side of the Zn-base layer without melting the first Al-base layer or the Zn-base layer, and
  a side opposing to the one side of the second Al-base layer directly contacts with a second side opposing to the first side of the Zn-base layer without melting the second Al-base layer or the Zn-base layer, and
  wherein a ratio of (total thickness of the first Al-base layer)/(total thickness of the Zn-base layer) is set to 1/60 to 1/3, and a ratio of (thickness of the first X-base layer)/(total thickness of the Zn-base layer and the first Al-base layer) is set to 0.0002/1 to 0.2/1.

12. A manufacturing method of junction structure, comprising a step of joining of a first connected member and a second connected member by heating the junction material of soldering according to claim 1 placed between the first and the second connected members.

13. The manufacturing method of junction structure according to claim 12, wherein the heating is conducted under the condition of retaining a temperature from 275° C. to 365° C. for 1 minute or longer, and the temperature of the junction structure is lowered.

14. The manufacturing method of junction structure according to claim 12, wherein the first connected member is a semiconductor device, and the second connected member is one of a frame, an insulating substrate, a lead and an electrode.

15. The junction material of soldering according to claim 6, wherein an intermetallic compound formed of CuAl is generated between the first X-base layer and the first Al-base layer, or between the second X-base layer and the second Al-base layer.

16. The junction material of soldering according to claim 7, wherein an intermetallic compound formed of AuAl is generated between the first X-base layer and the Al-base layer, or between the second X-base layer and the second Al-base layer.

17. The junction material of soldering according to claim 9, wherein a proportion of a film thickness of the first Al-base layer, the Zn-base layer, and a second Al-base layer expressed as (first Al-base layer film thickness):(Zn-base layer film thickness):(second Al-base layer film thickness) is set be in a range from 5:1:5 to 1:2:1.

* * * * *